(12) United States Patent
Mohr et al.

(10) Patent No.: US 8,589,139 B2
(45) Date of Patent: Nov. 19, 2013

(54) METHOD AND CIRCUIT CONFIGURATION FOR SIMULATING FAULT STATES IN A CONTROL UNIT

(75) Inventors: Paul Mohr, Weinstadt-Beutelsbach (DE); Henrik Jakoby, Ludwigsburg (DE); Mathias Koehrer, Stuttgart (DE); Robert Geiselmann, Kernen-Stetten (DE)

(73) Assignee: Robert Bosch GmbH, Stuttgart (DE)

( * ) Notice: Subject to any disclaimer, the term of this patent is extended or adjusted under 35 U.S.C. 154(b) by 820 days.

(21) Appl. No.: 12/223,938

(22) PCT Filed: Jan. 16, 2007

(86) PCT No.: PCT/EP2007/050382
§ 371 (c)(1),
(2), (4) Date: Dec. 2, 2010

(87) PCT Pub. No.: WO2007/096210
PCT Pub. Date: Aug. 30, 2007

(65) Prior Publication Data
US 2011/0078526 A1    Mar. 31, 2011

(30) Foreign Application Priority Data
Feb. 22, 2006  (DE) .................... 10 2006 008 539

(51) Int. Cl.
*G06F 17/50* (2006.01)
(52) U.S. Cl.
USPC .......................................................... 703/14

(58) Field of Classification Search
USPC .......................................................... 703/14
See application file for complete search history.

(56) References Cited

U.S. PATENT DOCUMENTS

| | | | | |
|---|---|---|---|---|
| 3,812,439 | A * | 5/1974 | Parmenter | 335/151 |
| 4,724,379 | A * | 2/1988 | Hoffman | 307/115 |
| 5,214,582 | A | 5/1993 | Gray | |
| 5,307,290 | A | 4/1994 | Raviglione et al. | |
| 5,465,010 | A * | 11/1995 | Rimmer | 307/9.1 |
| 5,798,647 | A | 8/1998 | Martin et al. | |
| 5,861,743 | A * | 1/1999 | Pye et al. | 324/763.01 |
| 7,472,367 | B1 * | 12/2008 | Xie et al. | 716/132 |
| 7,895,025 | B2 * | 2/2011 | Boutin | 703/13 |

FOREIGN PATENT DOCUMENTS

DE    43 17 175    11/1994
(Continued)

OTHER PUBLICATIONS

Jae-Cheon Lee et al., "Hardware-in-the Loop Simulator for ABS/TCS," 1999, Proceedings of the 1999 IEEE International Conference on Control Applications, pp. 652-657.*

(Continued)

*Primary Examiner* — Kamini S Shah
*Assistant Examiner* — Russ Guill
(74) *Attorney, Agent, or Firm* — Kenyon & Kenyon LLP

(57) ABSTRACT

A method and a circuit configuration for simulating fault states in a control unit, as well as a computer program and a computer-program product, are provided. In this context, a multiplexer and a fault-generating circuit are used, the multiplexer being realized using a relay technology, and the fault-generating circuit being implemented using a semiconductor technology.

15 Claims, 3 Drawing Sheets

(56) References Cited

FOREIGN PATENT DOCUMENTS

| | | |
|---|---|---|
| DE | 197 21 366 | 11/1998 |
| DE | 199 59 526 | 6/2001 |
| EP | 0 367 728 | 5/1990 |
| EP | 0 780 695 | 6/1997 |
| EP | 0 892 438 | 1/1999 |
| JP | 2-157671 | 6/1990 |

OTHER PUBLICATIONS

Herbert Schuette et al., "Hardware-in-the-Loop Testing of Vehicle Dynamics Controllers—A Technical Survey," Apr. 11, 2005, 2005 SAE World Congress, paper 2005-01-1660, 19 pages.*

Wagner, J. R.: "Failure Mode Testing Tool Set for Automotive Electronic Controllers" IEEE Transactions on Vehicular Technology, vol. 43, No. 1, Feb. 1994, pp. 156-163.

* cited by examiner

METHOD AND CIRCUIT CONFIGURATION FOR SIMULATING FAULT STATES IN A CONTROL UNIT

BACKGROUND OF THE INVENTION

1. Field of the Invention

The present invention relates to a method and a circuit configuration for simulating fault states in a control unit, particularly a control unit in a motor vehicle.

2. Description of Related Art

In vehicle control units, a considerable portion of the software is assigned to diagnostic functionalities. These diagnostics are intended to recognize faulty conditions in the vehicle, such as a line interruption, and to generate a corresponding entry for a fault memory.

Methods and circuit configurations for checking the functionality of electronic or electrical circuits are described in the related art. For example, published German patent document DE 197 21 366 describes an electrical circuit configuration, which is used for checking a series connection made up of a switch and a load. It includes a first circuit which is capable of detecting a first state, the first state representing a short-circuit of a connection point to a supply voltage, and a second circuit, connected in parallel to the first circuit, which is connected to the connection point and is used for detecting a second or a third state. The second state represents a short-circuit of the connection point to ground, and the third state represents an interruption of the connection point to the supply voltage.

The published German patent document DE 43 17 175 describes a self-testing device for memory arrays, decoders or the like, for use in an online operation. In that case, means are provided for checking a plurality of word lines and/or column lines, the word lines and/or column lines being connected to a check matrix, and a fault detector being connected to the check matrix and generating a fault signal if more than one line is activated at the same time.

A method for detecting faults in a motor vehicle is described in published German patent document DE 199 59 526. In that method, operating parameters and information for characterizing the operating parameters in a motor vehicle are acquired over a specific period of time. For the predictive detection of faults, it is suggested to create an operating-parameters pattern, to write an operating-parameters pattern in suitable form and to compare the operating parameters acquired instantaneously during the operation of the motor vehicle to the fault-characteristic operating-parameters pattern.

The circuit configuration introduced in the present invention is an electrical circuit which simulates typical faults that may occur in the vehicle. At present, various circuit configurations and methods are available for simulating faults in motor vehicles, these products offering the possibility of setting up various types of faults. Typical types of faults are listed in the following table.

TABLE 1

| No. | Type of fault: | Circuit for generating the fault: |
|---|---|---|
| 1 | Line interruption | Opening the connection between a control-unit pin and a component in the peripherals |
| 2 | Short-circuit at plus/minus potential pin of the battery voltage (or another voltage) | Connection of the control-unit to the plus/minus potential of the battery voltage (or another voltage) |
| 3 | Contact corrosion at the control-unit pin | Switching-in of a resistor between a control-unit pin and a peripheral component |
| 4 | Short-circuit of two control-unit pins | Connecting of two control-unit pins |
| 5 | Crosstalk between two control-unit pins | Connecting of two control-unit pins via a resistor |
| 6 | Power losses due to leakage currents at the control-unit pin | Connection of a control-unit pin to plus/minus potential of the battery voltage (or another voltage) with the aid of a resistor |

Typically, the faults are applied sequentially to the control-unit terminals or pins. In so doing, it is customary to use multiplexers. The expenditure for components can thereby be reduced considerably, since it is not necessary to establish a fault-simulation circuit for each channel.

It is known to create circuits using only Metal-Oxide-semiconductor Field-Effect Transistor (MOSFET) technology or only relay technology. Various disadvantages of these two procedures according to the related art can be concluded from the following Table 2.

TABLE 2

| No. | Description | MOSFET technology | Relay technology |
|---|---|---|---|
| 1 | Switching speed | ++ Rapid switching due to semiconductor technology | -- Slow switching due to delayed pick up/release of the relay contact and due to bouncing |
| 2 | Wear | ++ No wear, since no mechanically moving parts are used. | -- Wear due to mechanics, and by erosion of the contacts |
| 3 | Costs (switch technology is the main driver of costs) | -- High costs, since two MOSFETs per switching contact and electrical isolation between drive and useful signal are necessary. | ++ Low costs, since no expensive circuitry is needed and relays are inexpensive to acquire in the marketplace. |
| 4 | Problem case—line interruption | -- Since only a high-resistance state and no interruption between the control-unit pin and peripherals can be produced, in many cases, the diagnosis in the control unit is incorrect. | ++ By complete separation of the connection between the control-unit pin and peripherals, the type of fault is always clearly recognized in the control unit. |

++ Advantage
-- Disadvantage

A BRIEF SUMMARY OF THE INVENTION

The method of the present invention for simulating fault states in a control unit provides that terminals of the control unit to be checked are connected via a multiplexer to a fault-generating circuit, the multiplexer being realized using a relay technology, and the fault-generating circuit being implemented using a semiconductor technology.

The circuit configuration of the present invention is used for simulating fault states in a control unit and includes a multiplexer and a fault-generating circuit, the multiplexer being realized using a relay technology, and the fault-generating circuit being implemented using a semiconductor technology.

The goal of the circuit configuration according to the present invention for simulating faults is to optimize costs and to improve the switching properties by the combination of semiconductor and relay technology. In this context, the circuit configuration includes two parts:
1. multiplexer circuit
2. fault-generating circuit A transistor logic, preferably using MOSFETs, may be used as semiconductor technology.

The computer program of the present invention includes program code means for implementing a method according to the invention.

The computer-program product of the present invention includes precisely these program code means, which are stored on a machine-readable data carrier.

It is understood that the aforementioned features and the features yet to be explained below may be used not only in the combination indicated in each instance, but also in other combinations or by themselves, without departing from the scope of the present invention.

DETAILED DESCRIPTION OF THE INVENTION

Figure 1:
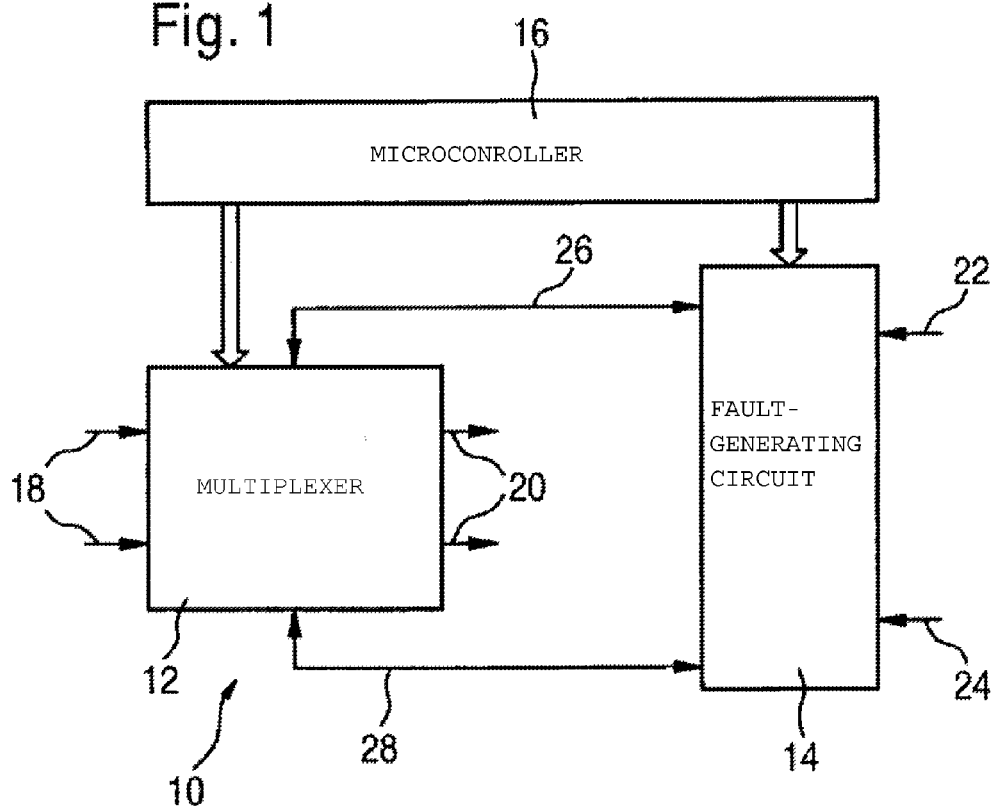
FIG. 1 shows an example embodiment of the circuit configuration according to the present invention in schematic representation.

The present invention is represented schematically in the drawing in light of exemplary embodiments, and is described in detail below with reference to the drawing.

FIG. 1 shows an example embodiment of the circuit configuration according to the present invention in schematic representation, which is denoted altogether by reference numeral 10. To be seen are a multiplexer 12, a fault-generating circuit 14 and a microcontroller 16 which takes on the control of the sequences of the fault simulation and therefore the control of the interactions between multiplexer 12 and fault-generating circuit 14.

Multiplexer 12 has a number of inputs 18 for the terminals, pin 1 through pin X, of the control unit to be checked, and a number of outputs 20 for driving the terminals of actuators and sensors.

Fault-generating circuit 14 has two voltage inputs (voltages U1 and U2), denoted by reference numerals 22 and 24, for the voltages necessary for the fault simulation, like, for example, a battery voltage.

Multiplexer 12 and fault-generating circuit 14 communicate via two bidirectional signal lines 26 and 28, which are also denoted as rail1 (reference numeral 26) and rail2 (reference numeral 28).

Multiplexer 12, i.e., the multiplexer circuit, is realized using relay technology, and fault-generating circuit 14 is implemented using MOSFET technology. A fault is generated by pre-configuring it in the first step, and activating it in the second step at the desired instant. Since this switch to active may always be realized by MOSFETs, it is possible to control the time behavior exactly.

The disadvantages indicated in the products available at present can be avoided by this procedure.
Disadvantage No. 1—Switching Speed:
Since the fault is always switched to active by MOSFETs, the time behavior is defined and the switching speed is correspondingly high (order of magnitude 20 µs).
Disadvantage No. 2—Wear:
Typically, all connected control-unit pins are fault-simulated in sequence. For each fault, fault-generating circuit 14 must switch to a fault state and back again to the initial state. When using the multiplexer relays, a channel is needed only a few times per simulation run-through; the switching cycles per relay are correspondingly small. In comparison to multiplexer circuit 12, fault-generating circuit 14 must switch much more frequently. Since fault-generating circuit 14 is realized using MOSFET technology and multiplexer circuit 12 is realized using relay technology, the wear is minimized.
Disadvantage No. 3—Costs:
Multiplexer 12 is implemented using cost-effective relay technology. Only 12 MOSFETs (in each instance in groups of two) are needed for fault-generating circuit 14. For example, if a product having 64 channels is offered, 192 relays and 12 MOSFETs are needed. Costs are thereby minimized.
Disadvantage No. 4 Problem Case—Power Interruption:
The power interruption is implemented redundantly in MOSFET and relay technology. Therefore, one or the other technology may be used from case to case.

Figure 2:
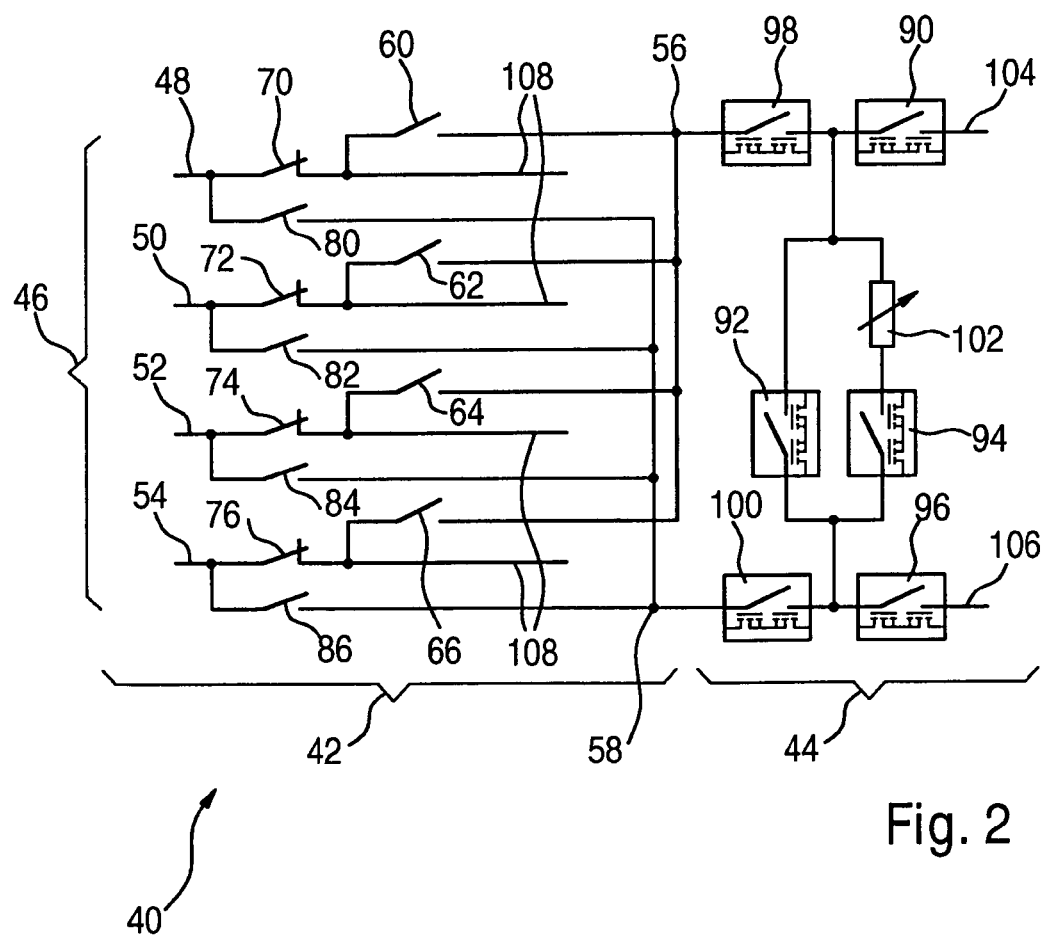
FIG. 2 shows a multiplexer and a fault-generating circuit.

FIG. 2 shows a circuit configuration 40 having a multiplexer 42 and a fault-generating circuit 44 for simulating faults.

Multiplexer 42 includes four input channels 46 for the control-unit terminals, pin 1 (reference numeral 48), pin 2 (reference numeral 50), pin 3 (reference numeral 52) and pin 4 (reference numeral 54). The connections to the fault-generating circuit are provided by rail1 (reference numeral 56) and rail2 (reference numeral 58). These fault rails 56 and 58 represent the connection between the output of multiplexer 42 and the input of fault-generating circuit 44.

Multiplexer relays K11 (reference numeral 60), K21 (reference numeral 62), K31 (reference numeral 64) and K41 (reference numeral 66) are provided for rail1 56. In the energized state, these relays switch the control-unit signal through to rail1 56.

Multiplexer relays K12 (reference numeral 70), K22 (reference numeral 72), K32 (reference numeral 74) and K42 (reference numeral 76) are used as interrupter relays. In the energized state, these relays interrupt the signal flow between the control-unit pin and the sensor/actuator.

Multiplexer relays K13 (reference numeral 80), K23 (reference numeral 82), K33 (reference numeral 84) and K43 (reference numeral 86) are provided for rail2. In the energized state, these relays switch the control-unit signal through to rail2 58.

Fault-generating circuit 44 includes six MOSFETs: M1 (reference numeral 90), M2 (reference numeral 92), M3 (reference numeral 94), M4 (reference numeral 96), M5 (reference numeral 98) and M6 (reference numeral 100). They realize e fault-generating circuit 44.

Also provided is a resistor cascade $R_{cascade}$ denoted by reference numeral 102. This resistor cascade 102 is used for faults which require simulation of resistance.

In addition, a first voltage input 104 is provided for a voltage U1, and a second voltage input 106 is provided for a voltage U2. These voltages are needed to simulate faults which require an external voltage.

In this case, typically the voltage of the vehicle battery or of a voltage stabilizer is connected. However, any other voltage source as desired may also be used. Sensors and actuators are connected to outputs 108.

Circuit configuration 40 shown is suitable for realizing or simulating all types of faults which correspond to the related art (see Table 1). Since these faults are switched using MOSFETs, the time behavior is suitable for the real-time fault simulation.

The individual faults are explained with reference to the circuit diagram in FIG. 2. In this context, there is a distinction made between fault configuration and fault activation. The fault configuration is needed to prepare the fault case, but the control unit detects no change in the signal behavior. The fault activation then alters the signal behavior at the control-unit pin; the control unit is now able to recognize a fault.

To keep the description general, in the case of the relays of the multiplexer, the first numeral of the relay name is replaced by an "X", the X standing for the channel number which, in principle, may be as large as desired. In the case of the fault activation, it is necessary to pay attention to the indicated sequence, so that the signal flow takes place in the manner desired.

No Fault Active:

This is the default state, when no fault is active. All relays of multiplexer circuit 42 are in the currentless state; all MOSFETS are in the non-conductive state. The signal flow between the control-unit pin and the sensor/actuator is produced via relays K12, K22 . . . .

Fault Type 1: Line Interruption

A. Line Interruption Via Relay

Fault Configuration

No configuration is necessary for this case.

Fault Activation

Break-contact relay KX2 is energized and therefore interrupts the signal flow between the control-unit pin and the sensor/actuator.

B. Line Interruption Via MOSFET

Fault Configuration

Relays KX1 and KX3 are energized, and therefore produce a connection to rail1 56 and rail2 58.

MOSFETs M5 98, M2 92, M6 100 become conductive, and therefore connect rail1 56 to rail2 58. The result is that the signal flow between the control-unit pin and the sensor/actuator is produced both via relay KX2 and via rail lines 56 and 58.

Relay KX2 is energized, causing the break-contact element of the relay to open. The signal flow between the control-unit pin and the sensor/actuator is now produced only via rail lines 56 and 58.

Fault Activation

MOSFET M2 92 is opened. The signal flow between the control-unit pin and the sensor/actuator is now interrupted.

Fault Type 2: Short-Circuit at Plus/Minus Potential of the Battery Voltage (or Another Voltage)

Fault Configuration

1. Case—Fault simulation via U1 104

Relay KX1 is energized and MOSFET M5 98 becomes conductive.

2. Case—Fault simulation via U2 106

Relay KX3 is energized and MOSFET M6 100 becomes conductive.

Fault Activation

1. Case—Fault simulation via U1 104

MOSFET M1 90 becomes conductive.

2. Case—Fault simulation via U2 106

MOSFET M4 96 becomes conductive.

Fault Type 3: Contact Corrosion at the Control-Unit Pin

Fault Configuration

Relays KX1 and KX3 are energized, and therefore produce a connection to rail1 56 and rail2 58.

MOSFETs M5 98, M2 92, M6 100 become conductive and thus connect rail1 56 to rail2 58. The result is that the signal flow between the control-unit pin and the sensor/actuator is produced both via relay KX2 and via rail lines 56 and 58.

Relay KX2 is energized, causing the break-contact element of the relay to open. The signal flow between the control-unit pin and the sensor/actuator is now produced only via the rail lines.

The desired resistance value is set at resistor cascade 102.

Fault Activation

MOSFET M2 92 becomes non-conductive, and MOSFET M3 94 becomes conductive at the same time.

Fault Type 4: Short-Circuit of Two Control-Unit Pins

Fault Configuration

The first control-unit pin is transferred to rail1 56 by the energizing of KX1.

The second control-unit pin is transferred to rail2 58 by the energizing of KX3.

MOSFETs M6 100 and M5 98 become conductive.

Fault Activation

MOSFET M2 92 becomes conductive.

Fault Type 5: Crosstalk Between Two Control-Unit Pins

Fault Configuration

The first control-unit pin is transferred to rail1 56 by the energizing of KX1.

The second control-unit pin is transferred to rail2 58 by the energizing of KX3.

MOSFETs M6 100 and M5 98 become conductive.

Resistor cascade 102 is set to the desired value.

Fault Activation

MOSFET M3 94 becomes conductive.

Fault Type 6: Power Losses Due to Leakage Currents at the Control-Unit Pin

Fault Configuration

Relays KX1 and KX3 are energized, and therefore produce a connection to rail1 56 and rail2 58.

MOSFETs M5 98, M2 92, M6 100 become conductive and therefore connect rail1 56 to rail2 58. The result is that the signal flow between the control-unit pin and the sensor/actuator is produced both via relay KX2 and via rail lines 56 and 58.

Relay KX2 is energized, causing the break-contact element of the relay to open. The signal flow between the control-unit pin and the sensor/actuator is now produced only via the rail lines.

The desired resistance value is set at resistor cascade 102.

Fault Activation

The leakage currents are able to flow either via U1 or via U2.

1. Case: Leakage current flows via U1 104

M5 98 and M2 92 become non-conductive.

M3 94 and M1 90 become conductive.

2. Case: Leakage current flows via U2 106

M6 100 and M2 92 become non-conductive.

M3 94 and M4 96 become conductive.

Figure 3:
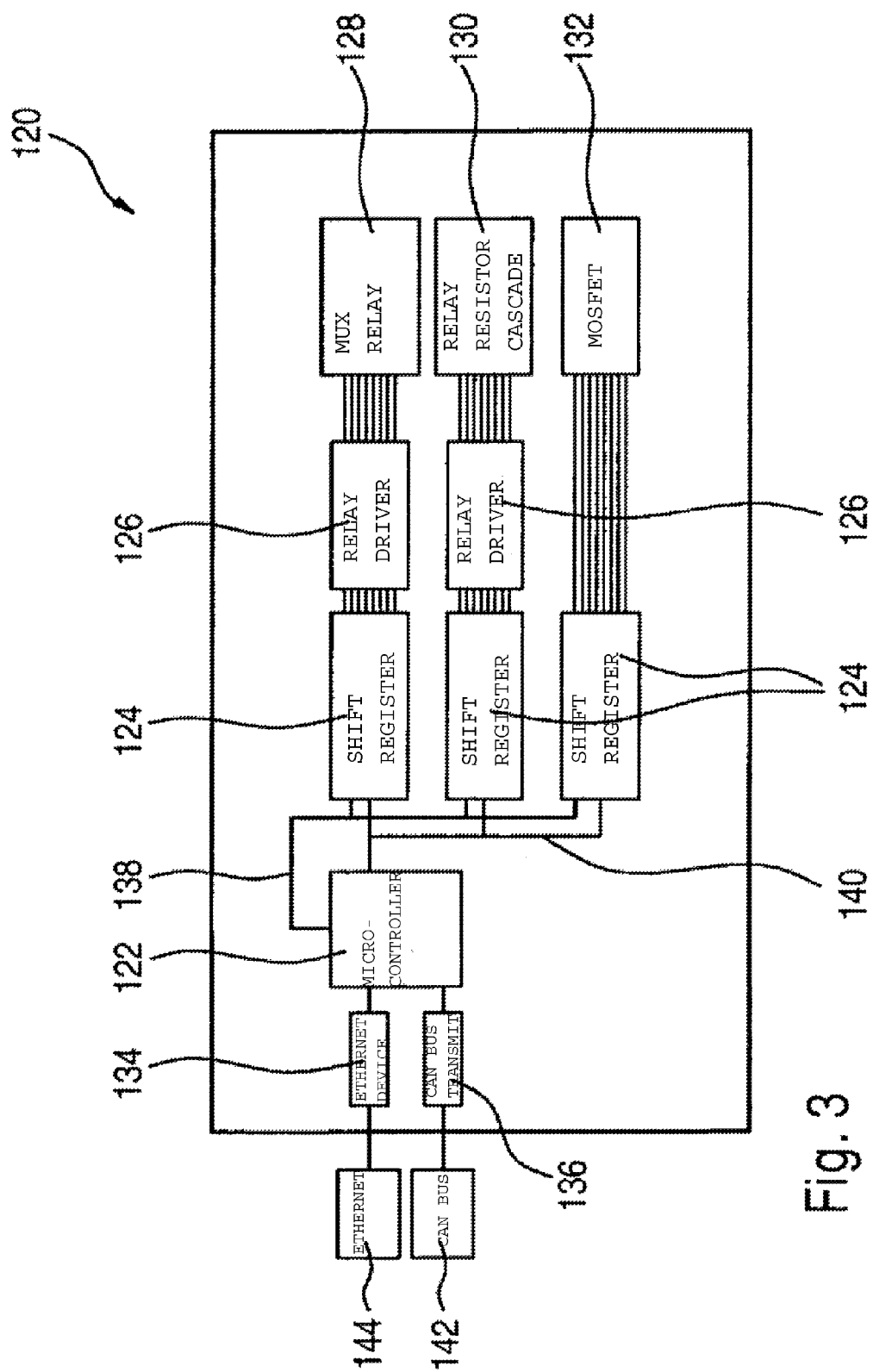
FIG. 3 shows a drive circuit for the circuit configuration according to the present invention.

FIG. 3 shows a drive circuit 120 for driving the circuit configuration according to the present invention. It includes one microcontroller 122, three shift registers 124, two relay drivers 126, one multiplexer relay 128, one relay resistor cascade 130, one MOSFET 132, one Ethernet device 134 and one CAN bus transmitter 136. The internal communication takes place via an activation line 138 and a serial bus 140. The drive circuit is to be operated at a CAN bus 142 or an Ethernet 144.

The communication between a fault-simulation device and a higher-level master computer takes place via CAN 142 or Ethernet 144. Using the firmware in microcontroller 122 of the fault-simulation device, the system is able to realize all faults indicated above. Typically, microcontroller 122 communicates with shift registers 124 via a serial protocol.

These registers 124 convert a serial bit stream into signals, which are present in parallel at the output pins of the register. To ensure that the signals are applied simultaneously to all pins of shift registers 124, an edge must be triggered on activation line 138 by microcontroller 122. The parallel signals at registers 124 are amplified by relay drivers 126, and relay 128 is therefore switched.

What is claimed is:

1. A method for simulating a fault state in a control unit, terminals of which are connected to a fault-generating circuit via a multiplexer that is realized using a relay technology, the fault-generating circuit being implemented using a semiconductor technology, the method comprising:
   simulating the fault state using the fault-generating circuit, wherein the simulating of the fault state includes: a) pre-configuring a fault in a first step by switching a relay and a first Metal-Oxide-Semiconductor Field-Effect Transistor (MOSFET); and b) subsequently activating the pre-configured fault in a second step by switching one of the first MOSFET and a second MOSFET.

2. The method as recited in claim 1, wherein the simulating of the fault includes simulating a line interruption.

3. The method as recited in claim 1, wherein the simulating of the fault includes simulating a short-circuit at a selected potential of a voltage.

4. The method as recited in claim 1, wherein the simulating of the fault includes simulating a contact corrosion at a control-unit terminal.

5. The method as recited in claim 1, wherein the simulating of the fault includes simulating a short-circuit of two control-unit terminals.

6. The method as recited in claim 1, wherein the simulating of the fault includes simulating a crosstalk between two control-unit terminals.

7. The method as recited in claim 1, wherein the simulating of the fault includes simulating line losses due to leakage currents at a control-unit terminal.

8. The method as recited in claim 1, wherein the multiplexer and the fault-generating circuit communicate via bidirectional signal lines.

9. The method as recited in claim 1, wherein:
   the fault state is a line interruption between a terminal of the control unit and one of a sensor and an actuator;
   the fault is a connection of the terminal to one of the sensor and the actuator via a first rail and a second rail that are interconnected by the one of the first MOSFET and the second MOSFET; and
   the line interruption is activated in the second step by opening the connecting MOSFET.

10. The method as recited in claim 1, wherein:
    the fault state is a short circuit of a terminal of the control unit at a voltage potential;
    the fault is a connection of the terminal to the second MOSFET, which second MOSFET is connected to the voltage potential; and
    the fault state is activated by switching the second MOSFET to a conductive state.

11. A circuit arrangement configured to simulate a fault state in a control unit, comprising:
    a multiplexer realized using a relay technology; and
    a fault-generating circuit connected to the multiplexer via a signal line;
    wherein:
       the fault-generating circuit is implemented using a semiconductor technology;
       the fault-generating circuit generates a fault; and
       the simulating of the fault state includes: a) pre-configuring a fault in a first step by switching a relay and a first Metal-Oxide-Semiconductor Field-Effect Transistor (MOSFET); and b) subsequently activating the pre-configured fault in a second step by switching one of the first MOSFET and a second MOSFET.

12. The circuit configuration as recited in claim 11, wherein the fault-generating circuit includes a transistor logic.

13. The circuit configuration as recited in claim 12, wherein the transistor logic is implemented using at least one of the first and the second MOSFET.

14. The circuit configuration as recited in claim 12, further comprising: a microcontroller configured to control a simulation of the fault.

15. A non-transitory computer-readable storage medium storing a computer program having program codes which program codes, when executed on a computer, control a method for simulating a fault state in a control unit, terminals of which are connected to a fault-generating circuit via a multiplexer that is realized using a relay technology, the fault-generating circuit being implemented using a semiconductor technology, the method comprising:
    simulating the fault state, wherein the simulating of the fault state includes: a) pre-configuring a fault in a first step by switching a relay and a first Metal-Oxide-Semiconductor Field-Effect Transistor (MOSFET); and b) subsequently activating the pre-configured fault in a second step by switching one of the first MOSFET and a second MOSFET.

\* \* \* \* \*

UNITED STATES PATENT AND TRADEMARK OFFICE
CERTIFICATE OF CORRECTION

PATENT NO. : 8,589,139 B2  Page 1 of 1
APPLICATION NO. : 12/223938
DATED : November 19, 2013
INVENTOR(S) : Mohr et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1490 days.

Signed and Sealed this
Twenty-second Day of September, 2015

Michelle K. Lee
*Director of the United States Patent and Trademark Office*